United States Patent [19]

Sitzmann et al.

[11] Patent Number: 5,705,116
[45] Date of Patent: *Jan. 6, 1998

[54] INCREASING THE USEFUL RANGE OF CATIONIC PHOTOINITIATORS IN STEREOLITHOGRAPHY

[76] Inventors: Eugene Valentine Sitzmann; Russell Frank Anderson; Darryl Keith Barnes; Ashwin B. Patel, all of AlliedSignal Inc. Research & Technology, 50 E. Algonquin Rd., Des Plaines, Ill. 60017-5016

[*] Notice: The term of this patent shall not extend beyond the expiration date of Pat. No. 5,494,618.

[21] Appl. No.: 463,086

[22] Filed: Jun. 21, 1995

Related U.S. Application Data

[63] Continuation-in-part of Ser. No. 266,829, Jun. 27, 1994, Pat. No. 5,494,618.
[51] Int. Cl.$^6$ .................... B29C 35/08; B29C 41/02
[52] U.S. Cl. ............................ 264/401; 264/308
[58] Field of Search ...................... 264/236, 308, 264/401; 156/272.8, 273.3, 273.5, 275.5, 307.1; 427/508, 510, 512, 553, 554, 555

[56] References Cited

U.S. PATENT DOCUMENTS

| | | | |
|---|---|---|---|
| 4,575,330 | 3/1986 | Hull | 425/174.4 |
| 5,036,112 | 7/1991 | Dougherty et al. | 522/31 |
| 5,079,129 | 1/1992 | Roth et al. | 430/280 |
| 5,371,115 | 12/1994 | Meier et al. | 522/13 |

FOREIGN PATENT DOCUMENTS

| | | |
|---|---|---|
| 2132064 | 3/1995 | Canada . |
| 152 377 | 8/1985 | European Pat. Off. . |
| 255 989 | 2/1988 | European Pat. Off. . |
| 646 580 | 4/1995 | European Pat. Off. . |
| 41 02 546 | 8/1991 | Germany . |
| WO 92-20014 | 11/1992 | WIPO . |

OTHER PUBLICATIONS

Crivello, "Advances in Polymer Science", 62, pp. 1–48 (1984).
U.S. Ser. No. 07/661,766, filed Feb. 27, 1991.
U.S. Ser. No. 07/693,890, filed May 1, 1991.
U.S. Ser. No. 07/855,392, filed Mar. 26, 1992.

Primary Examiner—Leo B. Tentoni

[57] ABSTRACT

Polymer precursor formulations suitable for stereolithography may be prepared from compositions containing vinyl ether functionalized compounds and epoxy functionalized compounds plus an effective mount of a cationic photoinitiator and an ultraviolet light-absorbing compound to provide a predetermined depth of cure. Preferably, the ultraviolet light-absorbing compound is anthracene or its derivatives. Anthracenes having pendant alkoxy groups are preferred for use with light wavelengths greater than 360 nm, particularly 9,10-dimethoxy-2-ethyl anthracene.

8 Claims, 2 Drawing Sheets

INCREASING THE USEFUL RANGE OF CATIONIC PHOTOINITIATORS IN STEREOLITHOGRAPHY

CROSS REFERENCE TO RELATED APPLICATION

This is a Continuation-in-Part of U.S. Ser. No. 08/266,829 filed Jun. 27, 1994 which issued as U.S. Pat. No. 5,494,618, on Feb. 27, 1996.

PRIOR ART

This invention relates to the art of stereolithography, which is a technique for forming solid shapes from a liquid polymer precursor. More particularly, the invention relates to improvements in such polymer precursors.

Stereolithography is described in U.S. Pat. No. 4,575,330 to Hull. The method involves building up a predetermined three-dimensional shape by forming a series of layers of polymerized solids. A cross-section of the solid is traced out on the surface of a bath of polymer precursors under the direction of a computer controlled system which causes the liquid to be exposed to a form of radiation such as an ultraviolet laser. After each polymerized layer is formed, it is lowered in the bath so that a new layer can be formed on top. Hull does not discuss in detail the type of polymer precursors which may be used, confining his discussion to the equipment used in the stereolithographic process. He states that the curable liquid (i.e., the polymer precursor) should cure fast enough to allow practical object formation times, should be self-adherent, should have a relatively low viscosity, should absorb UV light, should be soluble when not polymerized but insoluble when polymerized, and should be non-toxic. Hull suggests that acrylate formulations may be used and subsequent publications show that acrylate compositions have been preferred heretofore.

Acrylates are not entirely satisfactory for use in stereolithography. They are not as non-toxic as one would be like and they are not cured as rapidly and completely as would be desired. Post-curing of the solids formed by stereolithography is necessary and it is difficult to obtain rapid and complete curing of acrylates by exposure to intense UV light or exposure to elevated temperatures.

It is possible to employ polymer precursors based on vinyl ether compounds which have significant advantages over the acrylate-based formulations used heretofore in stereolithography. In U.S. patent application Ser. No. 07/661,766 filed on Feb. 27, 1991, compositions of vinyl ether oligomers and monomers were shown to be suitable for stereolithography.

Further improvement in compositions useful in stereolithography have been sought, particularly with regard to improving the accuracy of the finished parts. Improved compositions comprising vinyl ethers and epoxy compounds which provide advantages over those previously disclosed are disclosed in U.S. Ser. No. 07/693,890 filed May 1, 1991 and 07/855,392 filed Mar. 26, 1992.

Most stereolithographic equipment has used He-Cd lasers which expose the resins to ultraviolet light having a wavelength of about 324 nm. Recently, more powerful equipment has been introduced based on Ar ion lasers which use wavelengths of 351 and 364 nm or a group of wavelengths in the range of 334 to 364 nm. Since the cationic photoinitiators used with vinyl ether-epoxide mixtures respond best to light at about 300 nm, the stereolithography equipment using Ar ion lasers does not operate satisfactorily with such cationic photoinitiators, as will be explained in more detail below. Consequently, the present inventors have sought and have found a method of using such cationic photoinitiators successfully with stereolithographic equipment employing Ar ion lasers.

SUMMARY OF THE INVENTION

The invention relates to improvements in stereolithography, particularly with respect to equipment which employs Argon ion lasers. Such equipment typically operates at wavelengths between 334 and 364 nm, especially at 351 and 364 nm. At such wavelengths the cationic photoinitiators used with vinyl ether-epoxide monomers, such as onium salts, are not as effective since they respond best to UV light having a wavelength of about 300 nm. The result of the mismatch in wavelengths is that the monomers cure to an excessive depth because the light is not as readily absorbed by the cationic photoinitiators. The present inventors have found that addition of a small mount of UV light-absorbing materials is sufficient to reduce the depth of cure to a predetermined value suitable for the requirements of the specific stereolithographic equipment being used. Up to about 0.5 pph by weight is used, typically about 0.02 to 0.2 pph by weight. Typically the UV light absorbers are aromatic compounds, particularly those having fused rings. They absorb at the wavelength of the UV source and are non-volatile, non-basic, and do not produce visible color. The preferred compounds are anthracene and its derivatives.

Anthracene compounds of interest may be described by the following formula:

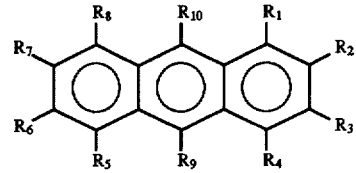

where:

$R_1-R_{10}$ are independently selected from the group consisting of H, alkyl, alkoxy, aryl, carboxyl, and carbinol moieties.

The preferred anthracene and/or anthracene derivatives are selected from the group consisting of anthracene, 9-anthroic acid, 9,10-diphenylanthracene, 9,10-dimethoxy-2-ethyl anthracene, and 9-anthracene methanol. They are added singly or in combination to the monomer mixture along with the photoinitiator before the mixture is used in stereolithography.

Other related compounds which may be used include, 9-phenyl anthracene, 2-methyl anthracene, 9-vinyl anthracene, and 9,10-dinaphthyl anthracene. Corresponding bianthranyl compounds and stilbene derivatives may also be used.

A preferred compound is 9,10-dimethoxy-2-ethyl anthracene. It has been found to have a sensitizing effect on onium photoinitiators when used at light wavelengths greater than 360 nm, especially at 364 nm with an argon ion laser. Other anthracenes containing at least two alkoxy moieties are expected to have the same effect. The alkoxy groups should be either opposite or adjacent each other on the anthracene fused rings.

In another aspect, the invention consists of a polymer precursor composition for use in stereolithography, particularly equipment employing Argon ion lasers. The composition includes vinyl ether functionalized compounds and epoxy functionalized compounds, along with an effective amount of a cationic photoinitiator, preferably an onium salt, and a sufficient amount of an ultraviolet light-absorbing compound, preferably anthracene and/or derivatives thereof, particularly 9,10-dimethoxy-2-ethyl anthracene, to provide a predetermined depth of cure of the vinyl ether and epoxy functionalized compounds.

Another embodiment of the invention is found in an ultraviolet light-absorbing mixture comprising an onium salt cationic photoinitiator and anthracene or its derivatives.

DESCRIPTION OF THE PREFERRED EMBODIMENTS

Stereolithography using Argon Ion Lasers

Figure 1:
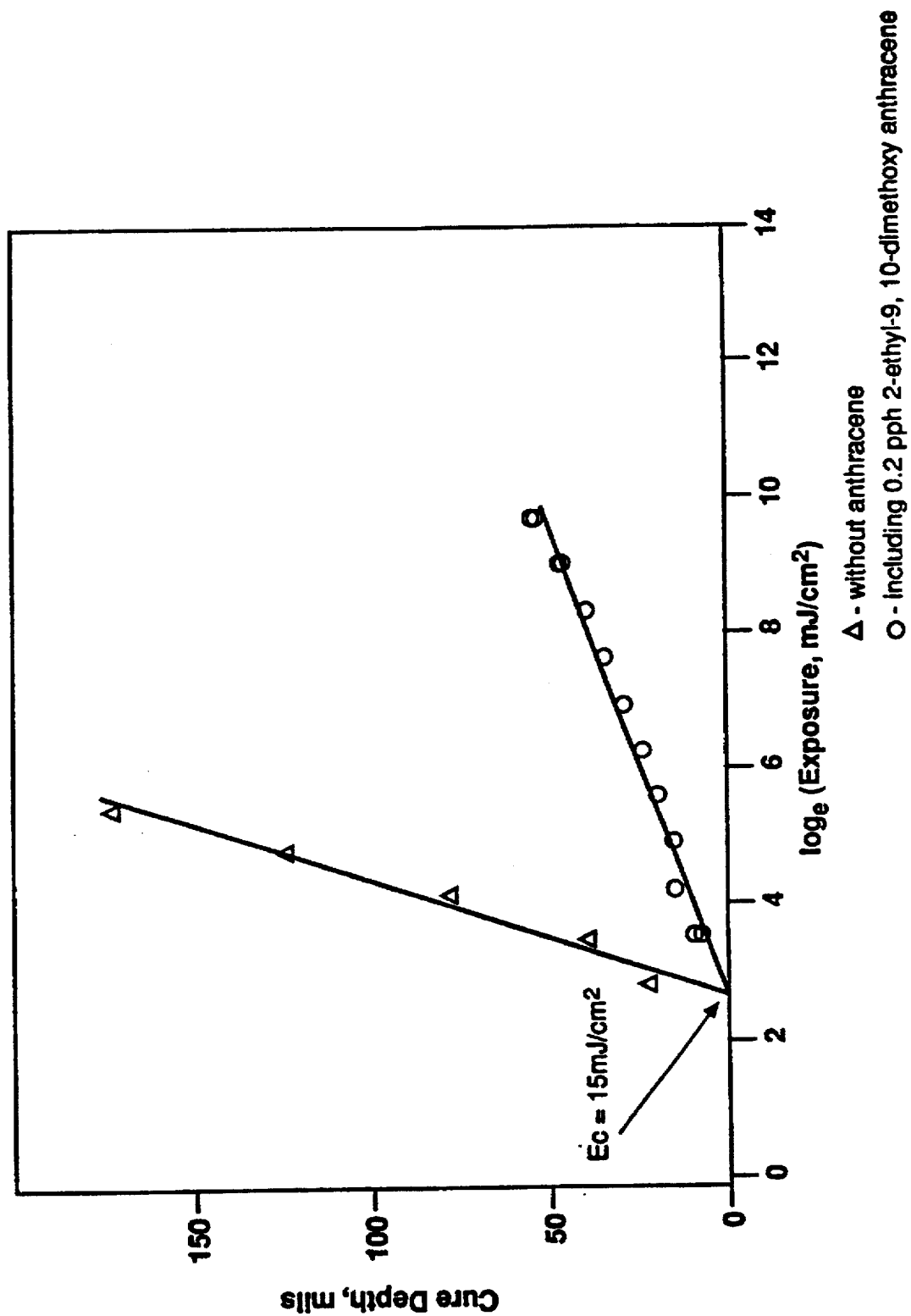
FIGS. 1 and 2 illustrate the effect on polymer cure depth of adding an anthracene derivative to an epoxy-vinyl ether monomer mixture.

In stereolithographic applications, the monomers are polymerized in successive layers to build up a solid object by exposure to actinic light, particularly a UV or visible laser beam, such as ultraviolet light from helium/cadmium laser or an argon ion laser or visible light from an argon ion laser. After the three-dimensional shape has been formed, it is removed from the monomer bath, washed as necessary with isopropanol or other suitable solvent, and cured further by thermal means, which could be supplemented by ultraviolet or visible light if desired.

It may be helpful to briefly review the principles on which stereolithography equipment operates in order to understand the problem faced by the present inventors and its solution. Passing a laser beam over the surface of a monomer bath causes the monomers to be polymedzed so that a thin layer of polymer is formed. These are built one on top of the other until the desired three-dimensional object is completed. To accomplish this objective one must consider a number of factors.

The laser introduces light energy (photons) into the liquid monomers along a narrow path. If there is sufficient total energy present, the photoinitiator will decompose and cause polymerization to occur. The minimum amount of energy required is termed Ec or $E_{crit}$. As the amount of energy (light exposure) is increased, the depth to which the monomers are polymerized is increased. This is termed Cd or cure depth. The relationship between the cure depth and the logarithm of the total light energy provided to each unit of area (commonly called the "working curve") should be linear and where this is so, the slope of the line on a plot of Cd versus $log_e$ E is called the depth of penetration, or Dp. This is a measure of the depth to which the light beam penetrates the liquid monomer. If the value is too large, say 2 to 4 times the desired thickness of the layer being produced, then the volume of the polymer is usually found to be greater than the volume being traced out by the laser beam. On the other hand, if the Dp value is 2 to 4 times smaller than the desired thickness of the layer, then to achieve the desired polymer depth the laser exposure time would have to be increased, leading to unacceptably long build-times.

The actual depth to which the laser light penetrates is determined by the absorbence of the monomers and the photoinitiator. In practice, since the photoinitiator is to absorb light and release the moieties which catalyze the polymerization, the amount of the photoinitiator is adjusted to control the depth of penetration and the cure depth for a given amount of light energy or exposure. Thus, for a given beam of fixed power and wavelength, the amount of the photoinitiator used will control the minimum amount of energy needed to cure the monomer (Ec) and the depth to which it is cured (Cd).

In many stereolithographic machines He-Cd lasers are used, which irradiate the monomer bath with ultraviolet light at a wavelength of about 324 nm. When such lasers are used with conventional acrylate monomers, the radical photoinitiators used respond well, having a useful range of about 300 to 380 nm. When introducing the use of vinyl ether-epoxide compositions, which provide substantial improvements in accuracy of the three-dimensional objects formed, it was necessary to use cationic photoinitiators, particularly onium salts, rather than the radical initiators used with acrylates. Although these cationic photoinitiators respond to ultraviolet light over a frequency range of about 300 to 350 nm, they typically have a peak response at about 300 nm. This means that, although the He-Cd laser has an operating frequency of about 324 nm, it is sufficiently close to the optimum frequency for the cationic initiators that the difference has proven to be no problem in using vinyl ether-epoxide monomers, as is described in the earlier co-pending and commonly-assigned patent applications. This has not been the experience with argon ion lasers which operate at frequencies between 334 and 364 nm.

At the typical operating wavelengths of argon ion lasers, 331 to 364 nm, particularly 351 and 364 nm, the cationic photoinitiators do not absorb the ultraviolet light readily. Consequently, the light penetrates the monomer bath to an undesirably great depth and produces a poorly defined polymer layer which does not accurately represent the desired shape. Previously, one skilled in the art would have concluded that the solution to such a problem would be found in either developing a new photoinitiator having a higher peak absorption wavelength that is in the range of the argon ion laser, or else an energy transfer agent or co-initiator would have to be found to permit the photoinitiator to react more readily at the higher light frequencies typical of the argon ion laser. Another potential method of improving the aamount of photoinitiator reacted and thus reducing the depth of light penetration might be to increase the amount of the photoinitiator used. However, this was found to be an impractical solution to the problem since the photoinitiators are not very soluble in the vinyl etherepoxide monomers. Also, increasing the aamount of photoinitiator would reduce shelf life of the mixture and degrade the color of the polymer.

The solution to the problem was found by the present inventors in the addition of small amounts of ultraviolet light-absorbing compounds, particularly of anthracene or anthracene compounds which absorb light in the wavelength range of the argon ion laser, preventing it from penetrating too deeply into the monomer bath. At the same time, these additives also absorb light at wavelengths which will excite the cationic photoinitiators, making it possible to reduce the depth of cure and consequently to produce thinner more accurate polymer layers. While absorbing light at the frequencies of the argon ion laser, the anthracene (or its compounds) fluoresces rather than producing heat, thus having little effect on the temperature of the monomer bath and the speed of polymerization which would result at higher temperatures.

UV Light Absorbers

The UV light-absorbing materials should be chosen from those which absorb strongly at the wavelengths of the argon ion laser (between 334 and 364 nm) but not absorb strongly at the lower wavelength of the helium-cadmium laser (325 nm) and below. Also, such materials should not react detrimentally with the photoinitiators or the resins. In particular, compounds which have desirable light-absorbing properties but are basic in nature, such as aromatic compounds which have amine, sulfide, or amide moieties should be avoided since they will interfere with the acid species released by the cationic photoinitiators used with vinyl ether-epoxide resins. In addition to these properties, the UV light absorbers should be reasonably soluble in the resins to be polymerized and should not add undesirable color to the product.

Preferred light-absorbing materials include aromatic compounds which have fused rings and particularly anthracene and its derivatives.

Anthracene compounds of interest may be described by the following formula:

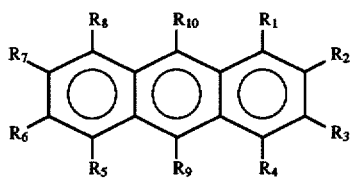

where:

$R_1$–$R_{10}$ are independently selected from the group consisting of H, alkyl, alkoxy, aryl, carboxyl, and carbinol moieties.

Especially preferred are members of the group consisting of anthracene, 9-anthroic acid, 9,10-diphenyl anthracene, 9,10-dimethoxy-2-ethyl anthracene, and 9-anthracene methanol.

Other related compounds which may be useful include 9-phenyl anthracene, 2-methyl anthracene, 9-vinyl anthracene, and 9,10-dinaphthyl anthracene.

Additional aromatic compounds may have application where they satisfy the requirements above, for example, bianthranyl and its derivatives and stilbene derivatives, such as BPSB (p-bis(p-propylstryl) benzene) and BMSB (p-bis (methylstryl)benzene).

A preferred compound is 9,10-dimethoxy-2-ethyl anthracene. It has been found to have a sensitizing effect on onium photoinitiators when used at light wavelengths greater than 360 nm, especially at 364 nm with an argon ion laser. It is believed that other anthracene derivatives which contain alkoxy moieties would have an advantageous effect on the photoinitiators, particularly those which contain at least two alkoxy groups. They would be expected to have the best effect when the alkoxy groups are opposite or adjacent each other on the anthracene fused rings.

The absorbers are used in small quantities, generally up to about 0.5 pph based on the monomers, typically about 0.02 to 0.2 pph. The amounts added to the monomer bath will be chosen to control the penetration depth, Dp, so that the cure depth will satisfy the requirements of the laser and of the layer thickness wanted.

Monomers

Compositions for use in stereolithography comprise vinyl ethers and epoxides. In general, vinyl ether functionalized compounds of interest would include those derived from urethanes, phenols, esters, ethers, siloxanes, carbonates and aliphatic or aromatic hydrocarbons. The epoxides will generally include the broad classes of available epoxy functionalized compounds such as those derived from phenols, particularly bisphenol A, novolacs, linear or cycloaliphatic diols, polyether diols and siloxanes.

By combining vinyl ethers with epoxides it is possible to rapidly cure the vinyl ethers while leaving the epoxide largely uncured. This provides a "green part" having sufficient strength to be handled but having little distortion. Then, the green piece can be thermally post-cured so that the epoxide cures under the influence of the photo acids generated during the UV or visible laser exposure. Thermal post-curing preferably is isotropic and any additional shrinkage that occurs should not produce additional distortion in the part.

The vinyl ethers may include vinyl ether oligomers and/or multifunctional and/or monofunctional vinyl ether monomers.

Vinyl Ether Oligomers

The vinyl ether oligomers may be generally described as

where R' and R'' are H or an alkyl group having 1 to 10 carbon atoms

A is a moiety derived from urethanes, phenols, polyesters, polyethers, polycarbonates, or polysiloxanes and has a molecular weight of about 400 to 10,000

Z is a moiety derived from a saturated aliphafic or cycloaliphatic hydrocarbon or a polyalkylene ether and has a molecular weight of about 28 to 250 n is an integer from 2 to 6, preferably 2 or more.

Such oligomers are described in detail below.

Vinyl Ether Urethane Oligomers

Where A is derived from a urethane the vinyl ether urethane oligomer may be obtained by reacting (i) a hydroxyl-terminated polyester having the formula

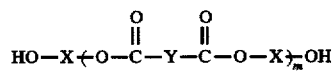

where X and Y are divalent radicals having a molecular weight of about 28 to 500 and selected from the group consisting of alkylene, arylene, aralkylene, and cycloalkylene radicals m has an average value of about 1 to 100 and (ii) a diisocyanate having the formula

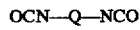

where Q is a divalent radical selected from the group consisting of alkylene, arylene, aralkylene, and cyctoallcylene radicals or a polyisocyanate having a functionality greater than 2 and (iii) a hydroxy monovinyl ether having the formula

where R' and R'' are mono valent radicals selected from the group consisting of H and alkyl groups having 1–10 carbon atoms Z is a divalent radical having a molecular weight of about 28 to 250 and selected from the group consisting of alkylene, cycloalkylene, or polyalkylene ether radicals In an alternative embodiment, the vinyl ether urethane oligomer may be one in which the polyester of (i) is replaced entirely or in part by a hydroxy-terminated polyether having the general formula HO—X—(O—X)$_m$—OH where m and x are as defined for the polyester of (i).

The moieties X and Y may be alkylene groups, especially those containing up to about 20 carbon atoms, a cycloalkylene group, an arylene, or aralkylene group. Examples of the alkylene moieties which may be used include ethylene, propylene, butylene, pentylene, hexylene, heptylene, octylene, nonylene, decylene, undecylene, dodecylene, tridecylene, tetradecylene, pentadecylene, hexadecylene, heptadecylene, octa-decylene, nonadecylene, and eicosylene. Examples of arylene groups include phenylene, naphthylene, anthrylene, phenanthrylene, etc. Cycloalkylene groups include the cyclopentylene, cyclohexylene, cycloheptylene, cyclooctylene, and cycloalkylene groups containing 1 or more alkyl groups on the nucleus. Similarly, the arylene groups which may be used for Y also may contain one or more alkyl groups on the aromatic ring, especially where such alkyl groups contain up to about 6 carbon atoms. Examples of aralkylene groups include benzylene, 1-phenethylene, 2-phenethylene, 3-phenylpropylene, 2-phenylpropylene, 1-phenylpropylene, etc. Particularly useful Y groups are —(CH$_2$)$_n$— groups where n is 2, 3, or 4; 1,2, 1,3, or 1,4 phenylene groups; and 1,4 cyclohexylene groups. Particularly useful X groups are —CH$_2$CH$_2$—; —CH$_2$CH$_2$—O—CH$_2$CH$_2$—; —CH$_2$—(CH$_3$)CH—; —(CH$_2$)$_n$— where n is 4 or 6; —CH$_2$—(CH$_3$)$_2$C—CH$_2$—; 1,4 phenylene; and 1,4-bis (methyl)phenylene.

m will be an integer from 1 to about 100, preferably from 1 to 10.

Particularly preferred hydroxyl-terminated polyesters include poly(propylene adipate), poly(neopentyl adipate), poly(1,4-butane adipate), poly(1,6-hexane adipate), poly (neopentyl isophthalate), and poly(1,6-hexane isophthalate). Polyesters derived from mixed polyols or acids may be useful. Particularly important are polyesters in which triols such as trimethylol propane or glycerol are incorporated into the polyester to produce a polyester with a functionality>2. The preferred molecular weights for the polyesters will be about 500 to 5000.

In the alternative embodiment where polyethers are used, X preferably will be —CH$_2$CH$_2$—, —CH$_2$(CH$_3$)CH—, and —CH$_2$CH$_2$CH$_2$CH$_2$—. The molecular weight preferably will be about 250 to 5,000. Mixed polyethers may also be used, for example, those derived from a polyol, such as ethoxylated or propoxylated trimethylol propane.

A broad variety of diisocyanates may be used and may be exemplified by such materials as the toluene diisocyanates (TDI), p- and m-phenylene diisocyanate, 1,4-tetramethylene diisocyanate, 1,6-hexamethylene diisocyanate, 2,2,4-trimethylhexamethylene diisocyanate, 1,4-cyclohexane diisocyanate, 4,4'-di-cyclohexylmethane diisocyanate (Desmodur W), 4,4'-diphenylmethane diisocyanate (MDI), 3,3'-dimethyl-4,4-diphenylmethane diisocyanate, 1,5-tetrahydronaphthalene diisocyanate, naphthalene-1,5'-diisocyanate, bis(2-methyl-3-isocyanatephenyl)methane, 4,4'-diphenylpropane diisocyanate, tetramethylxylene diisocyanate (TMXDI), isophorone diisocyanate (IPDI).

Polyisocyanates with a functionality of 2 or more such as are described and discussed in U.S. Pat. No. 4,435,067, especially the—polyisocyanates based on methylenediphenyl diisocyanate, especially the 4,4'-isomer and the uretonimine modified MDI as described there, also may be utilized. The term polyisocyanate also includes quasi prepolymers of polyisocyanates with active hydrogen containing materials where the polyisocyanate is typically reacted with from about 0.05 to about 0.3 equivalents of a polyol. Although a vast number of polyisocyanates are suitable, in practice polyisocyanates based on MDI and TDI may be preferred for economy and general availability.

Among the most desirable isocyanates may be mentioned 4,4'-diphenylmethane diisocyanate, toluene diisocyanate, isophorone diisocyanate, m-tetramethylxylene diisocyanate, 4,4'- dicyclohexylmethane diisocyanate (Desmodur W), and 1,6- hexamethylene diisocyanate.

The vinyl ether terminated alcohols which are used in preparing the oligomeric esters have a structure corresponding to the adduct of an alkyne and a diol. In one method, a diol may be reacted with acetylene. However, these vinyl ether terminated alcohols also can be made in other ways, and the method of producing them is not part of this invention. The resulting hydroxy monovinyl ether may be purified or in many cases the reaction mixture, which includes divinyl ether and residual diol may be used directly. The alkyne has the generic formula R'C≡CR", and the diol has the generic formula HO—Z—OH. The generic formula of the vinyl ether terminated alcohols of our invention is

R'CH=CR"O—ZOH.

The groups R' and R" are independently selected from the group consisting of hydrogen and lower alkyl moieties containing from 1 to 10 carbon atoms, although those with from 1 to about 4 carbon atoms are favored. It is preferable that both R' and R" are not alkyl moieties, for in the case where both are lower alkyl groups this causes an undesirable reduction in polymerization rate of the oligomers of our invention. Where R' is an alkyl moiety it is preferred that R" be hydrogen, and conversely; where R' is hydrogen then R" should be an alkyl of 1 to 4 carbons. In a preferred embodiment R' or R" is a methyl group and R" and R' is hydrogen. In a still more preferred embodiment both R' and R" are hydrogen.

Z will be a divalent radical having a molecular weight of 28 to about 250 and selected from the group consisting of alkylene, cycloalkylene, or polyalkylene ether radicals. In one preferred embodiment, Z is ethylene, butylene, or dimethylene cyclohexane radicals.

Among the diols one important class consists of alkylene glycols, HO(C$_n$H$_{2n}$)OH, where n is an integer from 2 to about 10. The linear alkylene glycols, HO(CH$_2$)$_n$OH, (polymethylenediols), where n is an integer from 2 to about 10, are particularly useful, especially where n is from 2 to about 6. Illustrative of the members of this group are such diols as ethylene glycol, 1,3-propylene glycol, 1,4-butanediol, 1,5-pentanediol, 1,6-hexanediol, 1,7-heptanediol, 1,8-octanediol, 1,9-nonanediol, and 1,10-decanediol (decamethylene glycol).

The nonlinear or branched alkylene diols also may be used, where such glycols contain from 3 up to about 10 carbon atoms. Examples include 1,2-propylene glycol, 2,3-butanediol, 2,3-dimethyl-2–3-butanediol, 2,3-dimethyl-1,4-butanediol, 2,2- dimethyl-1,3-propanediol (neopentylglycol).

Another useful class of diols are the polyalkylene glycols, especially poly(ethylene) glycols, HO[—CH$_2$CH$_2$O—]$_m$OH, and poly(propylene) glycol, HO[—CH(CH$_3$)CH$_2$O—]$_m$OH, where m is an integer from 1 up through about 50, although more usually m is an integer from 1 up to about 10, and most preferably from 1 up to about 5. Examples of these glycols include diethylene glycol, triethylene glycol, tetraethylene glycol, pentaethylene glycol, hexaethylene glycol, etc., along with the analogs of the propylene glycols.

Of particular importance is the case where Z is a divalent radical whose parent is a cycloalkane, such as cyclopentane, cyclohexane, cycloheptane, or cyclooctane, preferably the bishydroxy alkyl derivatives. The preferred diols are the 1,3-bis(hydroxyalkyl)cyclopentanes and the 1,4-bis(hydroxyalkyl)cyclohexanes, -cycloheptanes, and -cyclooctanes, particularly the cyclohexanes. Diols substituted at positions different from those specified above may be used in the practice of this invention, but not necessarily with equivalent results. The bis(hydroxymethyl)cyclohexanes are preferred as they are readily available from the reduction of the corresponding phthalic acids, and among these 1,4-bis(hydroxymethyl)cyclohexane is favored.

Of the hydroxy monovinyl ethers which are produced by the reaction of acetylene with the diols described above, those which are especially preferred include 4-hydroxybutyl vinyl ether, 4-hydroxymethyl cyclohexylmethyl vinyl ether, 2-hydroxy ethyl vinyl ether, triethylene glycol monovinyl ether, and diethylene glycol monovinyl ether. In addition to the pure hydroxymonovinyl ether, mixtures containing the corresponding divinyl ether R'HC=CR"—O—Z—O—R"C=CHR' and/or the parent diol HO—Z—OH may also be used.

An important characteristic of the vinyl ether terminated urethane oligomers is that in all cases there are few hydroxyl groups derived from the polyester, polyether or hydroxy monovinyl ether in the final product. That is, less than about 10% of the initial hydroxyl groups remain unreacted. It is most preferable that the oligomeric vinyl ether terminated product contain no detectable free hydroxyl groups, i.e., less than about 1% of the initial hydroxyl groups of the reactant mixture remain unreacted. It is also important that there should be essentially no free isocyanate groups remaining in the product, that is, less than about 1% of the initial isocyanate groups of the reactant mixture. In general, the ratios of polyester (a), diisocyanate (b) and monovinyl ether (c) are selected to provide an equal number of equivalents of hydroxyl and isocyanate groups.

The vinyl ether urethane oligomers may be formed by reacting the hydroxyl-terminated polyester (a) with the isocyanate compound (b) or by reacting the isocyanate (b) with the hydroxy vinyl ether (c) and thereafter reacting the adduct with the remaining component or alternatively, the three components may be co-reacted. The ratios of (a), (b), and (c) will be chosen so that the ratio of the total number of hydroxyl groups from (a) and (c) to the number of isocyanate groups from (b) is about 1:1. The ratio of the number of hydroxyl groups from (a) to the number of hydroxyl groups from (c) should be in the range from about 0.5 to 5. The reason may be carried out at temperatures in the range of 0° to 150° C. Solvents such as diethyl ether, methylene chloride, or toluene may be employed and later removed from the oligomers, or the components may be reacted in the absence of solvents. Divinyl ether monomers such as 1,4-cyclohexane dimethanol divinyl ether or triethylene glycol divinyl ether may also be used as solvents. Such compounds may be obtained as by-products in the preparation of hydroxy monovinyl ethers. Since they have no free hydroxyl groups they do not react with the isocyanates, but may remain with the oligomers and become included in the formulations used for stereolithography.

The reaction may be carried out without a catalyst, but a tin containing catalyst such as dibutyl tin dilaurate may be used.

Vinyl Ether Polyester Oligomers

Where A is derived from a polyester, they may be considered the product obtained by reacting (a) a dicarboxylic acid having the formula

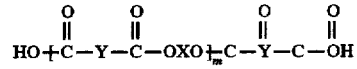

where X, Y, and m are defined above with respect to vinyl ether urethane oligomers (b) with a hydroxy monovinyl ether having the formula

where R', R" and Z are defined above with respect to vinyl ether urethane oligomers

Vinyl Ether Polysiloxanes

Where A is derived from a polysiloxane, they will typically include those in which a polysiloxane having Si—H groups is reacted by hydrosilation with a vinyl ether containing a second C=C group not directly bonded to an oxygen atom. The vinyl ether polysiloxanes may be defined as

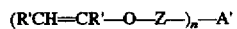

where R', R", and Z are as defined above.

n is an integer from 2 to 8

A' is a polysiloxane having n Si—H groups and a molecular weight of 140 to 5,000

The polysiloxane may be linear, cyclic, or a combination of both types and may be substituted with aliphatic or aromatic moieties. Preferred substituents on the Si atoms are methyl and phenyl groups.

Vinyl Ether Phenolics

Where A is derived from a phenol, they may be defined as

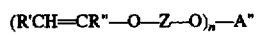

A" is a polyvalent aromatic radical having a molecular weight of about 152 to 5,000

R', R" and Z are as defined above n is 2to6

In one preferred embodiment Z is ethylene and A" is derived from 4',4'-isopropylidene diphenol (i.e. bisphenol A).

Vinyl Ether Polyethers

Where A is derived from a polyether they may be obtained by reacting poly(ethylene oxy), poly(propylene oxy) or poly(butyleneoxy) glycols, i.e., HO—[—CH$_2$CH$_2$O]$_m$—H, HO—[—CH(CH$_3$)CH$_2$O]$_m$—H, or HO—[—(CH$_2$)$_4$O]$_m$—H, respectively, where m has an average value from 2 to 50 with acetylene or a vinyloxy alkyl halide, for example, 2-chloroethyl vinyl ether.

Vinyl Ether Carbonates

Vinyl ether terminated carbonates may be described by the formula

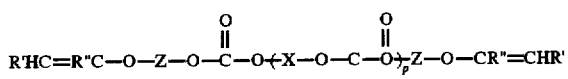

where p is 4 to 10
Z is a divalent radical as defined above
X is a diester, diol, or polyol moiety

Vinyl Ether Monomers

The structure or the vinyl ether monomers may be similar to those of the oligomers described above but the monomers will have lower molecular weights. When their viscosity is low, they are useful as reactive diluents in the stereolithography formulations.

The vinyl ether monomers may be generally described by the formula $$(R'CH{=}CR''{-}O{-}Z)_n{-}B$$

where R' and R" are as defined above
Z is as defined above
n is an integer from 1 to 4
B is derived from aromatic and aliphatic hydrocarbons, esters, ethers, siloxanes, urethanes, and carbonates, and has a molecular weight of about 60 to 400

Monofunctional monomers are those which have n=1, while the multifunctional monomers are those which have n=2 to 4.

Vinyl Ether Monomers from Esters

Vinyl ether terminated ester monomers may be described by the formula

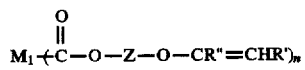

where n is 1 to 4,
$M_1$ is a mono, di, tri, or tetra functional radical having a molecular weight of 15 to 180 and selected from the group consisting of alkylene, arylene, aralkylene and cycloalkylene radicals,
Z is a divalent radical having a molecular weight of 28 to 290 and selected from the group consisting of alkylene, cycloalkylene, or polyalkylene ether radicals,
R' and R" are monovalent radicals selected from the group consisting of H and alkyl groups having 1–10 carbon atoms In one preferred embodiment $M_1$ is a mono, di, tri, or tetra functional radical of benzene. In another embodiment, $M_1$ is alkylene with 2–4 carbon atoms and Z is the α,α' diradical derived from 1,4-dimethylcyclohexane.

Vinyl Ether Monomers from Ethers

Vinyl ether terminated ether monomers are related to the polyether oligomers described above but the molecular weight is much lower, i.e., "m" is only about 1 to 5.

Vinyl Ether Monomers from Aliphatic Hydrocarbons

Vinyl ether terminated aliphatic monomers may be described by the formula

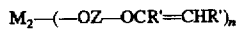

where n is 1 to 4
$M_2$ is a mono, di, tri, or tetra functional aliphatic or cycloaliphatic radical having a molecular weight of about 56 to 500
Z is a divalent radical as defined above
R' and R" are monovalent radicals as defined above

Vinyl Ether Monomers from Aromatic Hydrocarbons

Vinyl ether terminated aromatic monomers may be described by the formula

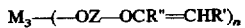

where n is 1 to 4
$M_3$ is a mono, di, tri, or tetrafunctional aromatic radical having a molecular weight of about 77 to 500
Z is a divalent radical as defined above
R' and R" are monovalent radicals as defined above

Vinyl Ether Siloxanes

Vinyl ether terminated siloxane monomers are related to the polysiloxane oligomers described above but the molecular weight is lower, i.e. A' has a molecular weight of about 140–500.

Vinyl Ether Carbonates

Vinyl ether terminated carbonate monomers are related to the oligomers described above but the molecular weight is lower, i.e. p is only about 0 to 3.

The vinyl ethers found to be useful may also be characterized by their physical properties and will generally have as many as possible of the following properties.

● have a fast cure under UV laser exposure so that a rigid "green" part can be made ● have low viscosity to facilitate flow of the prepolymers over the surface of the article being formed ● have a relatively high modulus as first formed by the laser beam, i.e., in the green form ● have a functionality of at least 2, that is, have at least two vinyl ether moieties in each molecule ● have minimal absorption of light from the laser beam Preferred vinyl ethers which have been found to be particularly useful include bisphenol A derivatives and other aromatic vinyl ethers including

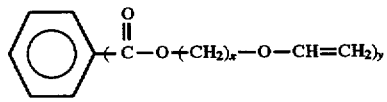

where x is 2 or 4
y is 2 or 3

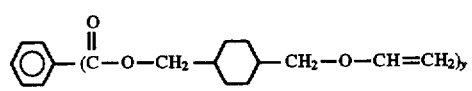

where y is 2 and ester derived vinyl ethers including

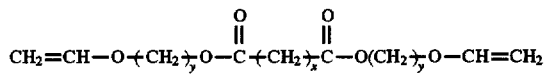

where x is 2, 3, or 4
y is 2 or 4
and

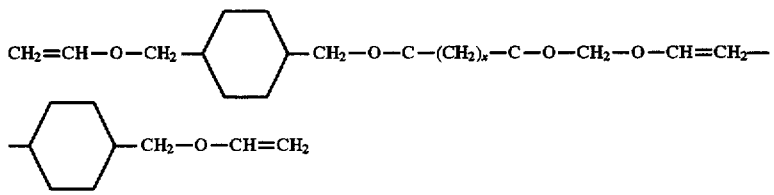

where x is 2, 3, or 4
and cycloaliphatic diol derived vinyl ethers including

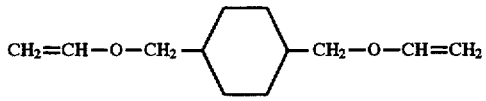

and poly ether derived divinyl ethers including

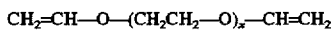

where x is 2, 3, or 4

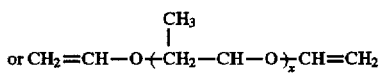

where x is 2, 3, or 4

$$CH_3CH_2-C(CH_2-O-CH_2CH_2-O-CH=CH_2)_3$$

and phenol derived vinyl ethers including

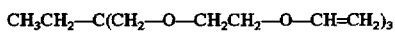

or

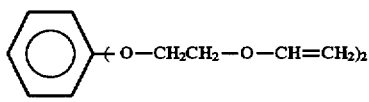

where R is H or $CH_3$

Vinyl ether oligomers may include urethane oligomers derived from isocyanates, such as MDI (4,4'-diphenylmethane diisocyanate), reacted with a hydroxyl terminated polyester such as poly(propylene adipate) and a mono vinyl ether such as cyclohexane dimethahol vinyl ether. Polyether oligomers may include polytetrahydrofuran reacted with acetylene to form the vinyl ether. Polyester oligomers include the reaction product of polytetrahydrofuran with dimethyl adipate, end-capped by reaction with bis(4-vinyloxybutyl)isophthalate.

Epoxides

The epoxides which are useful in the invention should have as many as possible of the following properties

- ● have a functionality of at least two, that is, have at least two oxirane moieties for each molecule
- ● have a low cure rate relative to the vinyl ethers used in the formulation
- ● contribute a low viscosity to the formulation
- ● do not plastidze vinyl ether polymerized by the laser
- ● are miscible with the selected vinyl ethers
- ● have minimal absorption of light from the laser beam Preferred epoxides include those derived from phenols, particularly bisphenol A, novolacs, linear and cyclo aliphatic polyols, poly ether polyols and siloxanes. In general, many of the available epoxides may find application in the invention. Of particular interest are glyddyl ethers of phenols. Cycloaliphatic epoxides, which may be used but not necessarily with equivalent results. Examples of glycidyl ethers are bisphenol A diglycidyl ethers (e.g. DER 331, 332, Dow Chemical) and Epon 828, Shell Chemical). Other examples are epoxy novolacs (e.g. Quatrex 240, DEN 431, Dow Chemical) and epoxy cresols (e.g. Quatrex 3310, Dow Chemical). Examples of cycloaliphatic epoxides (e.g. ERL-4221, ERL-4299, ERL-4234, Union Carbide).

Formulation of Polymer Precursor Compositions

In general, the formulations should have a viscosity in the range of 50 to 50,000 mPa●s, preferably 50–5000 mPa●s. The viscosity of the formulation should be relatively low in order to facilitate the movement of the liquid prepolymers over the solid piece being formed by the stereolithography apparatus. The vinyl ethers may have a high viscosity with the epoxides having low viscosity or vice versa. Alternatively, both may have low viscosity. High viscosities are useable, but not preferred.

The proportions of vinyl ethers and epoxides do not depend on their reaction with each other, since they primarily form homopolymers and the final product may be an interpenetrating polymer network. However, the proportions must be selected so that the green structure has acceptable strength and can retain the substantially unreacted epoxides until thermal post-curing can be carried out. It has been found that the proportions of vinyl ethers and epoxides should be within the boundaries defined by the formula $$M = \frac{F}{E}$$

where M is the vinyl ether equivalent weight of the composition
F is the total weight in grams of the composition, including both vinyl ether and epoxy compounds
E is the number of vinyl ether equivalents in the composition
The vinyl ether equivalent weight (M) should be between 80 and 800 and preferably between 120 and 450. The defining equation takes no account of the relative number of equivalents of epoxide groups, only the equivalents of vinyl ether groups. If the vinyl ether equivalent weight (M) is too high, the green strength may be too low. If M is too low, the curl distortion may be too high. In practice, the M value chosen will depend on the aamount of distortion or linear shrinkage which can be tolerated for the parts to be made from the formulation.

Another factor to be considered is the relative reaction speed of the vinyl ethers. Generally, the vinyl ether oligomers are less reactive, particularly the urethane oligomers. Since they also have a greater weight for the number of vinyl ether equivalents the value of M will be higher, making it desirable to include lower molecular weight polyfunctional vinyl ethers to decrease the value of M.

The value of $E_c$ or $E_{crit}$ is also a factor which must be considered when formulating for a stereolithographic application. This is defined as the lowest light exposure which forms a polymer. It is commonly measured by the technique described in Example 2 below. Too low a value of $E_c$ is undesirable since the formula may prematurely polymerize or it may decrease the accuracy of the parts. A high value of $E_c$ implies a slower rate of reaction and reduced production of parts. However, compensation is possible when formulating so that a desired value of $E_c$ is obtained by adjusting the amount of the photoinitiator. Among the vinyl ether oligomers and monomers the value of $E_c$ is affected by the molecular composition and structure of the substituents. For example, adding low molecular weight vinyl ethers will generally decrease the value of $E_c$, while increasing the aamount of vinyl ether oligomers will generally increase the value. The present inventors have found that $E_c$ is not generally affected by addition of anthracene or its derivatives in the small amounts required to change the depth of cure of the monomers. An exception is the use of 2-ethyl-9,10-dimethoxy anthracene, as will be seen in the examples below, which appears to act as a sensitizer for onium salts. The effect is evident at wavelengths above about 360 nm when the onium salts absorb little energy.

Ambient humidity will affect the rate of polymerization. Consequently, it may be necessary to adjust the value of $E_c$ by reformulation, typically to lower the $E_c$ to compensate for the effect of increased humidity.

Still another factor to be considered is the effect of heat released during polymerization. When the polymerization reaction is too fast, damage to the polymer may result. Less reactive vinyl ethers would be chosen to avoid such a result or the value of M could be increased. An advantage of using anthracene or its derivatives to adjust the depth of cure that their response is to fluoresce rather than to generate heat which could adversely affect the polymerization of vinyl ethers and epoxides.

An effective amount of a cationic photoinitiator is used to cause the vinyl ethers to react and produce the desired polymer. The recognized classes of cationic photoinitiators include various compounds which respond to irradiation by producing acid species capable of catalyzing cationic polymerization. See Crivello, *Advances in Polymer Science*, 62, p. 1–48 (1984). Onium salts of Group V, VI, and VII elements are stated to be the most efficient and versatile of the cationic photoinitiators. They generate strong Lewis acids which can promote eationic polymerization. Curing of the vinyl ether compositions of the invention is not limited to a particular class of such photoinitiators, although certain types are preferred, including onium salts based on halogens and sulfur. More specifically, the onium salt photoinitiators described in Crivello's U.S. Pat. No. 4,058,400 and in particular iodonium and sulfonium salts of $BF_4^-$, $PF_6^-$, $SbF_6^-$, and $SO_3CF_3^-$. Preferred photoinitiators are triarylsulfonium salts, and diaryliodonium salts. Preferred anions are hexafluorophosphate and hexafluoroantimonate. They are usually required in amounts from about 0.1 to 5 wt.% in the blended formula of vinyl ethers and epoxides. Preferred initiators include:

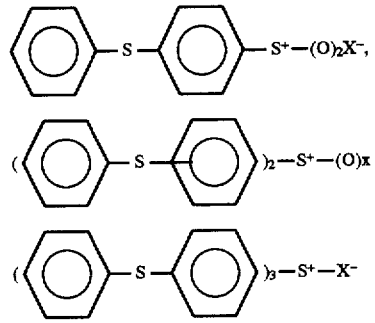

where X is $SbF_6^-$ or $PF_6^-$

Commercially available initiators include UVI-6974 (an $SbF_6^-$ salt) and UVI-6990 (a $PF_6^-$ salt) supplied by Union Carbide. Other cationic photoinitiators are defined by the formulas

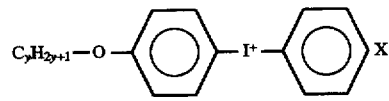

and

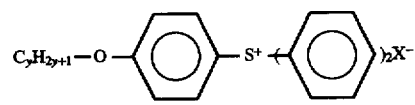

where y is 1 to 18

In addition to the principal ingredients discussed above, the formulations may also contain dyes, stabilizers, fillers, pigments, and antioxidants such as hindered phenols, wetting agents such as fluorosurfactants e.g. FC-430 from 3-M, photosensitizers such as benzophenone, thioxanthone, perylene and other components familiar to those skilled in the art.

EXAMPLE 1

A stereolithographic composition was prepared by mixing 56% by weight of isophthaloyl-dibutyoxy vinyl ether (4010 SF, AlliedSignal) and 44% by weight of the diglycidyl ether of bisphenol (DER-331, Dow Chemical) with 0.475 pph of UVI-6974 (Union Carbide) a triaryl sulfonium salt as a cationic photoinitiator.

EXAMPLE 2

A sample of the composition of Example 1 was placed in a shallow dish in a 3D Systems Model SLA-190 stereolithographic unit and maintained at 30° C. The He-Cd laser (325 nm and 10.0 mW) was scanned across the resin to produce a series of small rectangular shaped cured layers which had been exposed to different doses of UV light by varying the speed of the laser beam's movement. The test part was removed from the bath after less than one minute and the thickness of the rectangular layers were measured with a micrometer to provide the depth of cure obtained with each dose of UV light. This information when plotted yields a straight line relationship between the logarithm of the light dose (exposure) and the depth of cure. Where the line intersects the exposure axis defines the critical exposure Ec, which is the least exposure which will produce polymerization. The slope of the line defines Dp, which is called the "penetration depth" although it is more accurately stated as the change in cure depth for a change in exposure (light dose). Such a graph will be found in FIG. 1 below, which illustrates the effect of adding 0.2 pph of an anthracene derivative (2-ethyl-9-10-dimethoxy anthracene) to an epoxy-vinyl ether mixture.

EXAMPLE 3

The variation of the minimum exposure needed to cure the monomers (Ec) and depth of cure with exposure (Dp) with the amount of the photoinitiator was measured by the method of Example 2 is shown in the table below, for measurements made with the SLA-190 He-Cd laser.

TABLE A

| UVI-6974 (pph) | Ec (mJ/cm$^2$) | Dp (mils) |
|---|---|---|
| 0.475 | 7.63 | 7.18 (0.18 mm) |
| 0.75 | 4.20 | 4.25 (0.11 mm) |

It can be seen that addition of the photoinitiator decreases both the UV exposure needed for polymerization (Ec) and the change of the depth of cure with UV exposure (Dp).

EXAMPLE 4

The measurements of Example 3 were repeated using a SLA-190 (3D Systems, Inc.) stereolithographic apparatus employing an Argon ion UV laser as an excitation source, operating at a wavelength of 351 nm and power of 19.2 mW. The variation of Ec and Dp are reported in the following table.

TABLE B

| UVI-6974 (pph) | Ec (mJ/cm$^2$) | Dp (mils) |
|---|---|---|
| 0.475 | 15.45 | 34.77 (0.88 mm) |
| 0.75 | 8.57 | 19.09 (0.48 mm) |

Comparing the results in Table B with those of Table A, it can be seen that the minimum UV dose required with the Argon ion laser is much larger than with the He-Cd laser. This is believed to be the result of the longer wavelengths of the Argon laser which are further removed from the optimum wavelength (300 nm) to which the onium salt photoinitiator responds. The cure depth change is also much larger for the Argon laser. The result is that the laser beam penetrates too deeply and the definition of the region where the polymer is formed is degraded. While the preferred value of Dp will depend on a number of factors, it is generally the case that values of about 4.5 to 8.0 mils (0.11 to 0.20 mm) are preferred.

EXAMPLE 5

The effect of adding an anthracene derivative, 9-anthracene methanol (AM), to the composition of Example 1 was determined as in Examples 2 to 4, with the results obtained being reported in the following table.

TABLE C

| UVI-6974 (pph) | AM (pph) | He—Cd 325 nm 10 mW | | Ar$^+$ 351 nm 19.2 mW | | Ar$^+$ 364 nm 30.6 mW | |
|---|---|---|---|---|---|---|---|
| | | Ec | Dp | Ec | Dp | Ec | Dp |
| 0.475 | 0 | 7.63 | 7.8 | 15.45 | 34.77 | — | — |
| 0.475 | 0.1 | 5.06 | 4.88 | 32.81 | 6.54 | 83.37 | 6.83 |
| 0.75 | 0.1 | 3.63 | 3.32 | 16.00 | 5.71 | 67.16 | 6.83 |
| 0.75 | 0.2 | 3.33 | 2.78 | 13.53 | 2.84 | 22.24 | 8.68 |

It can be seen that the addition of the anthracene methanol has the effect of reducing the UV exposure required to polymerize the monomers and of reducing the depth of polymer curing. The changes in Ec and Dp are particularly noticeable in the case of the Argon ion laser. The practical effect of these changes is that with the addition of the light screen the resin is able to be used with Argon ion lasers to make useful three-dimensional parts.

EXAMPLE 6

The experiments of Example 5 were repeated in greater detail with respect to the performance of the Argon ion laser equipment. The results of tests in which the concentration of the photoinitiator and the 9-anthracene methanol were varied in a monomer mixture as in Example 1 are presented in the following table.

TABLE D

| UVI-6974 (pph) | AM (pph) | Laser Power @ 351 nm | Ec | Dp |
|---|---|---|---|---|
| 0.75 | 0.1 | 24.6 | 25.22 | 5.84 |
| 0.75 | 0.08 | 24.2 | 23.88 | 7.08 |
| 0.75 | 0.05 | 24.2 | 26.96 | 8.98 |
| 0.825 | 0.08 | 24.5 | 23.67 | 6.87 |
| 0.825 | 0.04 | 24.5 | 24.15 | 10.83 |
| 0.825 | 0.0203 | 24.6 | 21.18 | 14.83 |
| 0.9 | 0.08 | 20.2 | 19.07 | 6.69 |
| 0.9 | 0.0618 | 20.2 | 19.31 | 7.95 |
| 0.9 | 0.04 | 20.3 | 22.03 | 10.55 |
| 0.9 | 0.0258 | 20.3 | 21.79 | 13.00 |
| 1.0 | 0.08 | 20.2 | 18.76 | 6.45 |
| 1.0 | 0.0626 | 20.1 | 19.74 | 7.846 |
| 1.0 | 0.03 | 20.1 | 21.93 | 11.56 |

It may be concluded from the above table that Dp is affected mainly by changes in AM concentration, while $E_c$ is mainly affected by changes in photoinitiator concentration.

EXAMPLE 7

The absorbance or optical density was measured by ultraviolet spectroscopy using monomer compositions according to Example 1 in which the amounts of photoinitiator and 9-anthracene methanol were varied. Values which correspond to the characteristic wavelengths of He-Cd (324 nm) and Argon ion (332, 334, 350, 352, 364 nm) lasers are reported in the following table.

TABLE E

| UVI-6974 | AM | Optical density at wavelength (nm) | | | | | |
|---|---|---|---|---|---|---|---|
| | | He—Cd | | Ar ion | | | |
| (pph) | (pph) | 324 | 3324 | 334 | 350 | 352 | 364 |
| 0.475 | 0 | 1.1038 | 0.7967 | 0.7304 | 0.2978 | 0.2672 | 0.1815 |
| 0.475 | 0.1 | 1.2361 | 1.0284 | 0.9779 | 0.7820 | 0.7397 | 0.6649 |
| 0.75 | 0.1 | 1.5361 | 1.2480 | 1.1748 | 0.7823 | 07280 | 0.6216 |
| 0.75 | 0.2 | 1.6004 | 1.4408 | 1.3871 | 1.2880 | 1.2272 | 1.1380 |

It can be seen that the addition of 9-anthracene methanol markedly changed the absorption of the AR light at all of the wavelengths measured. This increase in light absorption is particularly noticeable in the region of the Argon ion laser. This means that Dp will change and thus, the slope of the "working curve" of the cured polymer.

EXAMPLE 8

Figure 2:
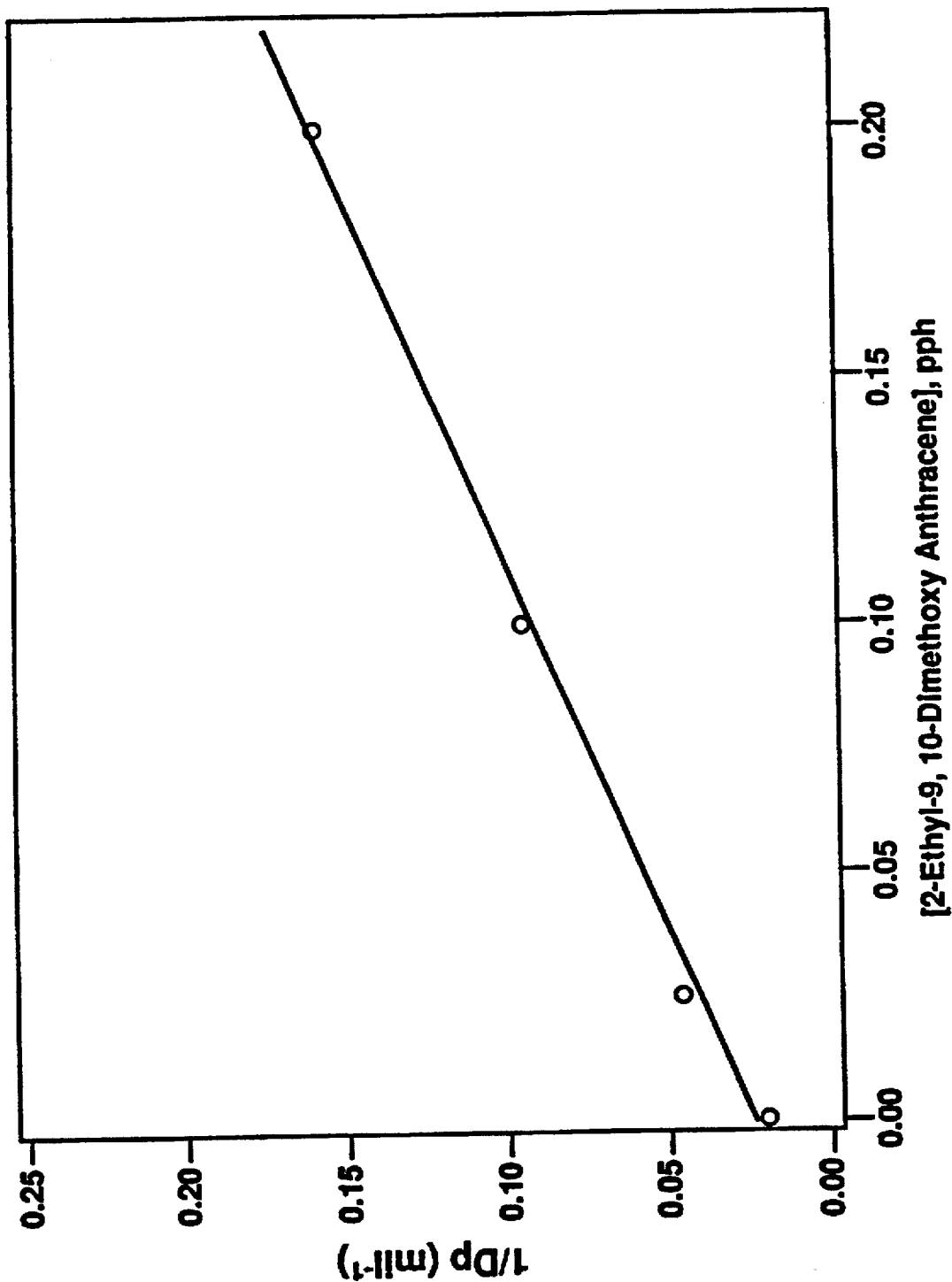

The monomer composition of Example 1 was tested according to the method of Example 2 using an Argon ion laser providing wavelengths of 333.6, 334.4, 335.8, 351.4, 351.1, and 363.8 nm (Innova 305). The concentration of 2-ethyl-9,10-dimethoxy anthracene was varied to show the effect on the minimum exposure for polymerization (Ec) and the change in cure depth for each unit of UV exposure (Dp). The results are shown in the following table and in FIG. 2.

TABLE F

| AM (pph) | Ec (mJ/cm$^2$) | Dp (mil) |
|---|---|---|
| 0.0 | 14.4 | 50.91 (1.5 mm) |
| 0.025 | 18.4 | 22.04 (0.56 mm) |
| 0.100 | 20.4 | 10.52 (0.27 mm) |
| 0.200 | 15.1 | 6.21 (0.16 mm) |

It can be seen that the minimum UV exposure (Ec) did not correlate with the concentration of AM, but Dp was a linearly decreasing function of AM concentration.

EXAMPLE 9

The viscosity at various temperatures was measured with a Brookfield DV-I instrument (spindle #28) for the formulation of Example 1 and a second formulation including 0.1 pph of 9-anthracene methanol. The results are shown in the following table.

TABLE G

| AN | Viscosity @ 30° C. (cps or mPa · s) | |
|---|---|---|
| (pph) | As prepared | Aged at 80° C. for 72 hours |
| 0 | 230 | 262 |
| 0.1 | 262 | 295 |

The change in viscosity upon aging appears not to have been affected by adding anthracene methanol. It may be concluded that the shelf life of the formulation was not significantly affected.

EXAMPLE 10

The effect of changing the concentration of 2-ethyl-9,10-dimethoxy anthancene (EDMA) was measured using a composition similar to that of Example 1 except that 53 wt.% of Vectomer™ vinyl ether and 47 wt.% of DER 331 was used with 0.9 pph of UVI 6974. The Ec and Dp for two wavelengths (351 nm and 364 nm) were determined using an Argon ion laser. The results are shown in the following table.

TABLE H

| Concentration of EDMA | Working Curves at 351 nm | | Working Curves at 364 nm | |
|---|---|---|---|---|
| (pph) | Ec mJ/cm$^2$ | Dp mil | Ec mJ/cm$^2$ | Dp mil |
| 0.0 | 16.95 | 19.51 | — | — |
| 0.073 | 14.60 | 10.36 | 49.4 | 11.82 |
| 0.140 | 13.14 | 7.13 | 27.45 | 6.35 |
| 0.2 | 11.9 | 5.54 | 19.74 | 4.78 |

It can be seen that, contrary to previous expectations that the Ec is reduced at these two wavelengths and particularly at the highest wavelength (364 nm) where an argon ion laser produces a large amount of its UV output. In Example 1 where a He-Cd laser was used (325 nm) the Ec was not affected by adding EDMA. We conclude that that compound is particularly effective at the higher wavelengths characteristic of the Argon ion laser. The onium salt has negligible adsorption at this wave length, consequently we believe that EDMA is a photosensitizer at these wavelengths.

EXAMPLE 11

The composition of Example 10 was used with two UV absorbing compounds, EDMA and anthracene methanol (AnthMeOH). The effectiveness of the two materials is quite different, as shown in the following table:

| | Working Curves at 324 nm | | Working Curves at 351 nm | | Working Curves at 364 nm | |
|---|---|---|---|---|---|---|
| Sample | Ec mJ/cm$^2$ | Dp mil | Ec mJ/cm$^2$ | Dp mil | Ec mJ/cm$^2$ | Dp mil |
| 0.073 pph 9-AnthMeOh | 5.29 | 3.20 | 23.54 | 7.66 | 105.44 | 9.94 |
| 0.175 pph EDMA | 3.22 | 2.68 | 9.10 | 5.91 | 26.5 | 5.36 |

Since the desired range of Ec for stereolithography is up to about 40 to mJ/cm$^2$, typically 5–15 mJ/cm$^2$, with a Dp of 4.5 to 8 mil, it is evident that EDMA is useful at 364 nm while AnthMeOH is not.

EXAMPLE 12

The aging experiment of Example 9 was repeated using EDMA in the formulation of Example 10. The results are shown in the following table:

TABLE J

| Sample | Fresh viscosity at 33° C. ± 1° C. | Aged at 80° C. for 72 hours viscosity at 33° C. ± 1° C. | Difference |
|---|---|---|---|
| 0.073 pph 9-AnthMeOH | 240 cps (mPa · s) | 303 cps (mPa · s) | 26% |
| 0.175 pph EDMA | 241 cps (mPa · s) | 258 cps (mPa · s) | 7% |

It can be seen that the effect of EDMA on aging is less than AnthMeOH or a composition containing no UV absorbing compound (Example 9).

We claim:

1. In the process of stereolithography in which a three-dimensional object is built up in successive layers by polymerizing cationically polymerizable monomers by the catalytic action of cationic photoinitiators activated by a moving beam of ultraviolet light, the improvement comprising adding as an ultraviolet light absorbing compound in quantities sufficient to provide a predetermined depth of cure and having the formula

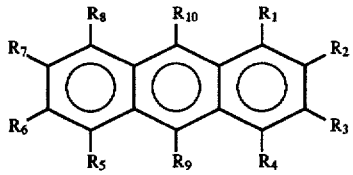

where:

$R_1$–$R_{10}$ are independently selected from the group consisting of H, alkyl, alkoxy, aryl, carboxyl, and carbinol moieties.

2. The process of claim 1 where at least two of $R_1$–$R_{10}$ are alkoxy.

3. The process of claim 2 wherein $R_2$ is ethyl and $R_9$ and $R_{10}$ are —$OCH_3$.

4. The process of claim 2 wherein said light absorbing compound is up to 0.5 pph relative to said monomers.

5. The process of claim 1 wherein said monomers are a mixture of epoxides and vinyl ethers.

6. The process of claim 5 wherein said mixture has a vinyl ether equivalent weight of 80 to 800.

7. The process of claim 1 wherein said stereolithography employs an argon ion laser.

8. The process of claim 7 wherein said argon ion laser emits ultraviolet energy primarily at 364 nm.

* * * * *